(12) United States Patent
Fouquet et al.

(10) Patent No.: US 8,061,017 B2
(45) Date of Patent: Nov. 22, 2011

(54) METHODS OF MAKING COIL TRANSDUCERS

(75) Inventors: Julie E. Fouquet, Portola Valley, CA (US); Richard A Baumgartner, Palo Alto, CA (US); Gary R. Trott, San Mateo, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 152 days.

(21) Appl. No.: 12/393,596

(22) Filed: Feb. 26, 2009

(65) Prior Publication Data

US 2009/0243783 A1    Oct. 1, 2009

Related U.S. Application Data

(63) Continuation-in-part of application No. 12/059,979, filed on Mar. 31, 2008, and a continuation-in-part of application No. 12/059,747, filed on Mar. 31, 2008, now Pat. No. 7,852,186, and a continuation-in-part of application No. 11/512,034, filed on Aug. 28, 2006, now Pat. No. 7,791,900, and a continuation-in-part of application No. 12/392,978, filed on Feb. 25, 2009, now Pat. No. 7,741,943.

(51) Int. Cl.
*H01F 7/06* (2006.01)

(52) U.S. Cl. ............ 29/606; 29/602.1; 29/605; 336/65; 336/83; 336/200; 336/206; 336/208

(58) Field of Classification Search ............... 29/592.1, 29/62.1, 603.23, 605, 606, 831, 832, 837; 336/65, 83, 90–96, 200, 206–208, 323
See application file for complete search history.

(56) References Cited

U.S. PATENT DOCUMENTS

| | | | |
|---|---|---|---|
| 4,027,152 A | 5/1977 | Brown et al. |
| 4,494,100 A | 1/1985 | Stengel et al. |
| 4,541,894 A | 9/1985 | Cassat |
| 4,931,075 A | 6/1990 | Kuhn |
| 5,070,317 A | 12/1991 | Bhagat |
| 5,312,674 A | 5/1994 | Haertling et al. |
| 5,363,081 A | 11/1994 | Bando et al. |
| 5,420,558 A | 5/1995 | Ito et al. |
| 5,597,979 A | 1/1997 | Courtney et al. |
| 5,659,462 A | 8/1997 | Chen et al. |
| 5,693,871 A | 12/1997 | Stout |
| 5,716,713 A | 2/1998 | Zsamboky et al. |
| 5,754,088 A | 5/1998 | Fletcher et al. |

(Continued)

FOREIGN PATENT DOCUMENTS

CN    180277    6/1996

(Continued)

OTHER PUBLICATIONS

U.S. Appl. No. 11/264,956, filed Nov. 1, 2005, Guenin et al.

(Continued)

*Primary Examiner* — Paul D Kim

(57) ABSTRACT

Various embodiments of means and methods for reducing the pick-up of electromagnetic interference ("EMI") by coil transducers are described and shown that are configured to provide high voltage isolation and high voltage breakdown performance characteristics in small packages. In some embodiments, the lengths, heights, and horizontal distances between wires electrically connecting transmitter circuits and receiver circuits to coil transducers are minimized and optimized respecting one another.

18 Claims, 7 Drawing Sheets

U.S. PATENT DOCUMENTS

| | | | |
|---|---|---|---|
| 5,825,259 | A | 10/1998 | Harpham |
| 5,952,849 | A | 9/1999 | Haigh |
| 6,167,475 | A | 12/2000 | Carr |
| 6,175,293 | B1 | 1/2001 | Hasegawa et al. |
| 6,198,374 | B1 | 3/2001 | Abel |
| 6,215,377 | B1 | 4/2001 | Douriet et al. |
| 6,255,714 | B1 | 7/2001 | Kossives et al. |
| 6,307,457 | B1 | 10/2001 | Wissink et al. |
| 6,320,532 | B1 | 11/2001 | Diede |
| 6,404,317 | B1 | 6/2002 | Mizoguchi et al. |
| 6,476,704 | B2 * | 11/2002 | Goff .............................. 336/200 |
| 6,489,850 | B2 | 12/2002 | Heineke et al. |
| 6,501,364 | B1 | 12/2002 | Hui et al. |
| 6,525,566 | B2 | 2/2003 | Haigh et al. |
| 6,538,313 | B1 | 3/2003 | Smith |
| 6,574,091 | B2 | 6/2003 | Heineke et al. |
| 6,661,079 | B1 | 12/2003 | Bikulcius et al. |
| 6,686,825 | B2 | 2/2004 | Tamezawa et al. |
| 6,856,226 | B2 | 2/2005 | Gardner |
| 6,859,130 | B2 | 2/2005 | Nakashima et al. |
| 6,867,678 | B2 | 3/2005 | Yang |
| 6,870,456 | B2 | 3/2005 | Gardner |
| 6,873,065 | B2 | 3/2005 | Haigh et al. |
| 6,888,438 | B2 | 5/2005 | Hui et al. |
| 6,891,461 | B2 | 5/2005 | Gardner |
| 6,903,578 | B2 | 6/2005 | Haigh et al. |
| 6,919,775 | B2 * | 7/2005 | Wendt et al. .................. 333/118 |
| 6,922,080 | B2 | 7/2005 | Haigh et al. |
| 6,943,658 | B2 | 9/2005 | Gardner |
| 6,944,009 | B2 | 9/2005 | Nguyen et al. |
| 6,970,040 | B1 | 11/2005 | Dening |
| 7,064,442 | B1 | 6/2006 | Lane et al. |
| 7,170,807 | B2 | 1/2007 | Fazan et al. |
| 7,171,739 | B2 | 2/2007 | Yang et al. |
| 7,376,116 | B2 | 5/2008 | Rozenblit et al. |
| 7,425,787 | B2 | 9/2008 | Larson, III |
| 7,436,282 | B2 | 10/2008 | Whittaker et al. |
| 7,460,604 | B2 | 12/2008 | Dupuis |
| 2002/0075116 | A1 | 6/2002 | Peels et al. |
| 2002/0110013 | A1 | 8/2002 | Park et al. |
| 2002/0135236 | A1 | 9/2002 | Haigh |
| 2003/0042571 | A1 | 3/2003 | Chen et al. |
| 2004/0056749 | A1 | 3/2004 | Kahlmann et al. |
| 2004/0214759 | A1 | 10/2004 | Alsobrook, II et al. |
| 2005/0003199 | A1 | 1/2005 | Takaya et al. |
| 2005/0057277 | A1 | 3/2005 | Chen et al. |
| 2005/0077993 | A1 | 4/2005 | Kanno et al. |
| 2005/0094302 | A1 | 5/2005 | Matsuzaki et al. |
| 2005/0128038 | A1 * | 6/2005 | Hyvonen ..................... 336/182 |
| 2005/0133249 | A1 | 6/2005 | Fujii |
| 2005/0269657 | A1 | 12/2005 | Dupuis |
| 2005/0272378 | A1 | 12/2005 | Dupuis |
| 2006/0028313 | A1 | 2/2006 | Strzalkowski et al. |
| 2006/0095639 | A1 | 5/2006 | Guenin et al. |
| 2006/0152322 | A1 | 7/2006 | Whittaker et al. |
| 2006/0170527 | A1 | 8/2006 | Braunisch |
| 2006/0176137 | A1 | 8/2006 | Sato et al. |
| 2006/0220775 | A1 | 10/2006 | Ishikawa |
| 2007/0085447 | A1 | 4/2007 | Larson, III |
| 2007/0085632 | A1 | 4/2007 | Larson, III et al. |
| 2007/0086274 | A1 | 4/2007 | Nishimura et al. |
| 2007/0133933 | A1 | 6/2007 | Yoon et al. |
| 2007/0281394 | A1 | 12/2007 | Kawabe et al. |
| 2007/0290784 | A1 | 12/2007 | Nesse et al. |
| 2008/0007382 | A1 | 1/2008 | Snyder |
| 2008/0031286 | A1 | 2/2008 | Alfano et al. |
| 2008/0051158 | A1 | 2/2008 | Male et al. |
| 2008/0061631 | A1 | 3/2008 | Fouquet et al. |
| 2008/0174396 | A1 | 7/2008 | Choi et al. |
| 2008/0176362 | A1 | 7/2008 | Sengupta et al. |
| 2008/0179963 | A1 | 7/2008 | Fouquet et al. |
| 2008/0180206 | A1 | 7/2008 | Fouquet |
| 2008/0198904 | A1 | 8/2008 | Chang |
| 2008/0278275 | A1 | 11/2008 | Fouquet |
| 2008/0284552 | A1 * | 11/2008 | Lim et al. ..................... 336/200 |
| 2008/0308817 | A1 | 12/2008 | Wang et al. |
| 2008/0311862 | A1 | 12/2008 | Spina |
| 2009/0072819 | A1 | 3/2009 | Takahashi |
| 2009/0180403 | A1 | 7/2009 | Tudosoiu |
| 2009/0243782 | A1 | 10/2009 | Fouquet et al. |
| 2009/0243783 | A1 | 10/2009 | Fouquet et al. |
| 2010/0020448 | A1 | 1/2010 | Ng et al. |
| 2010/0052120 | A1 | 3/2010 | Pruitt |
| 2010/0188182 | A1 | 7/2010 | Fouquet et al. |
| 2010/0259909 | A1 | 10/2010 | Ho et al. |
| 2010/0328902 | A1 | 12/2010 | Ho et al. |

FOREIGN PATENT DOCUMENTS

| | | |
|---|---|---|
| CN | 1237081 | 12/1999 |
| DE | 19911133 | 10/2000 |
| DE | 10154906 | 5/2003 |
| EP | 1309033 | 5/2003 |
| EP | 1617337 | 1/2006 |
| GB | 2403072 | 6/2004 |
| JP | 57-39598 | 3/1982 |
| JP | 61-59714 | 3/1986 |
| JP | 3171705 | 7/1991 |
| JP | 06-53052 | 2/1994 |
| JP | 2000-508116 | 6/2000 |
| JP | 2003-151829 | 5/2003 |
| JP | 2005-513824 | 5/2005 |
| WO | WO 9734349 | 3/1997 |
| WO | WO-2005/001928 | 6/2005 |
| WO | WO-2007/053379 | 5/2007 |

OTHER PUBLICATIONS

U.S. Appl. No. 11/512,034, filed Aug. 28, 2006, Fouquet et al.

U.S. Appl. No. 11/747,092, filed May 10, 2007, Fouquet et al.

"ACCL-9xxx 3.3V/5V High Speed CMOS Capacitive Isolator", *Preliminary Datasheet, Avago Technologies* uknown.

"Advanced Circuit Materials, High Frequency Laminates and Flexible Circuit Materials", *Rogers Corporation*, www.rogerscorporation.com/mwu/translations/prod.htm Mar. 2008.

"Allfex Flexible Printed Circuits", *Design Guide*.

"Off the Shelf SMT Planar Transformers", *Payton Group International* uknown.

"Texas Instruments Dual Digital Isolators", *SLLS755E* Jul. 2007.

Analog Devices, Inc., "iCoupler Digital Isolator ADuM1100 Data Sheet", *Rev F* 2006.

Chen, Baoxing, "iCoupler Products with Iso Power Technology", *"Signal and Power Transfer Across Isolation Barrier Using Microtransformers" Analog Devices* 2006.

Electronic Design, "Planar Transformers make Maximum Use of Precious Board Space", *Penton Media, Inc., ED Online ID#7647* Mar. 9, 1998.

Krupka, J. et al., "Measurements of Permittivity, Loss Dielectric Tangent, and Resistivity of Float-Zone Silicon at Microwave Frequencies", *IEEE Abstract Microwave Theory and Techniques, IEEE Transaction on vol. 54, Issue 11* Nov. 2006, 3995-4001.

Myers, John et al., "GMR Isolators", *Nonvalatile Electronics, Inc.* 1998.

Yang, R-Yuan, "Loss Characteristics of Silicon Substrate with Different Resistivities", *Microwave and Optical Technology Letters, vol. 48, No. 9* Sep. 2006.

Analog Devices, "iCoupler R Digital Isolation Products", 2005.

Chen, Baoxing et al., "High Speed Digital Isolators Using Microscale On-Chip Transformers", Jul. 22, 2003.

Fiercewireless, "Skyworks Introduces Industry's First Multi-band, Multi-mode TDD/TDD Power Amplifier for 4G LTE Applications Next-Generation TEC", Dec. 18, 2008, 6 pages.

Kliger, R., "Integrated Transformer-Coupled Isolation", Mar. 2003.

Smith, Carl H. et al., "Chip-Size Magnetic Sensor Arrays", May 21, 2002.

Oljaca, Miroslav, "Interfacing the ADS1202 Modulator with a Pulse Transformer in Galvanically Isolated Systems", *SBAA096* Jun. 2003, 22 pages.

\* cited by examiner

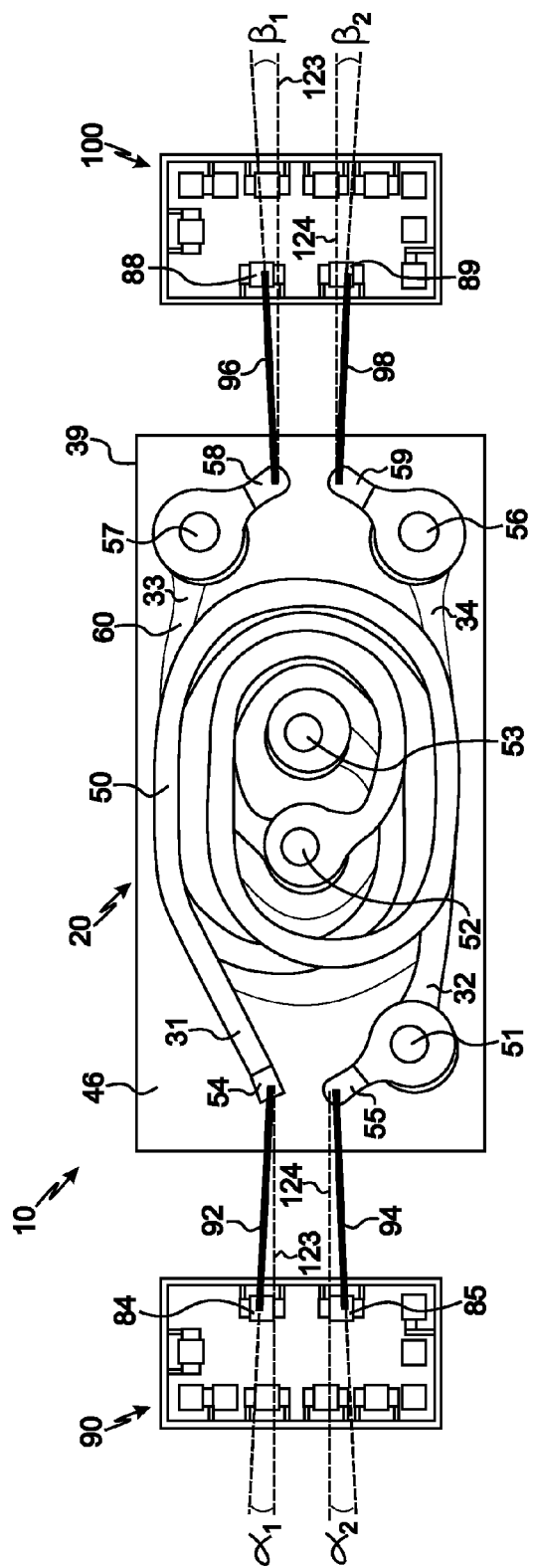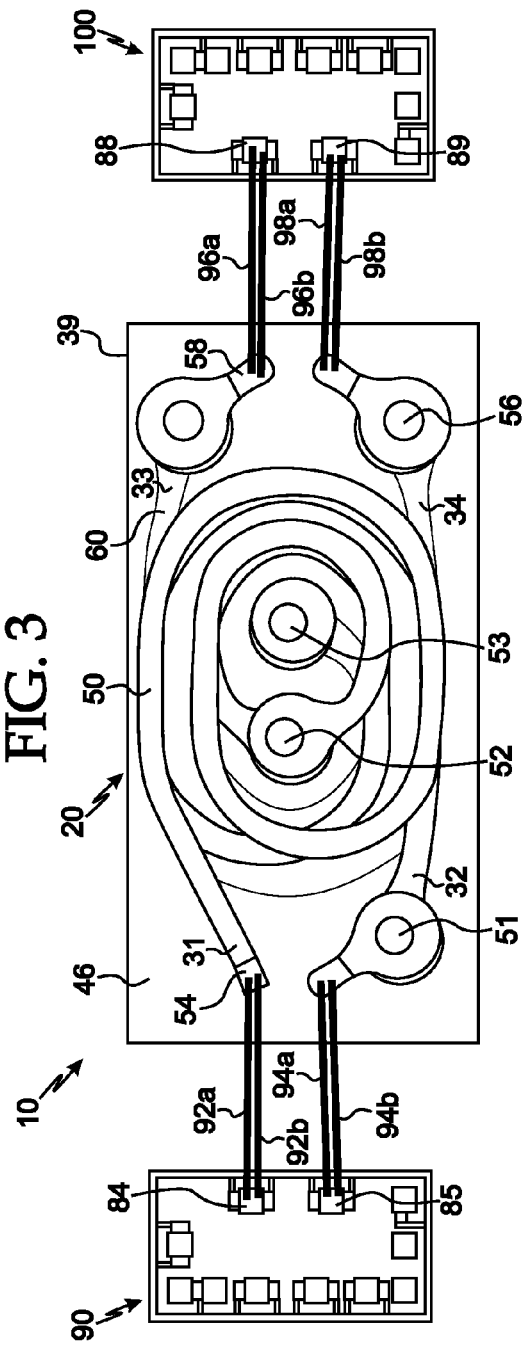

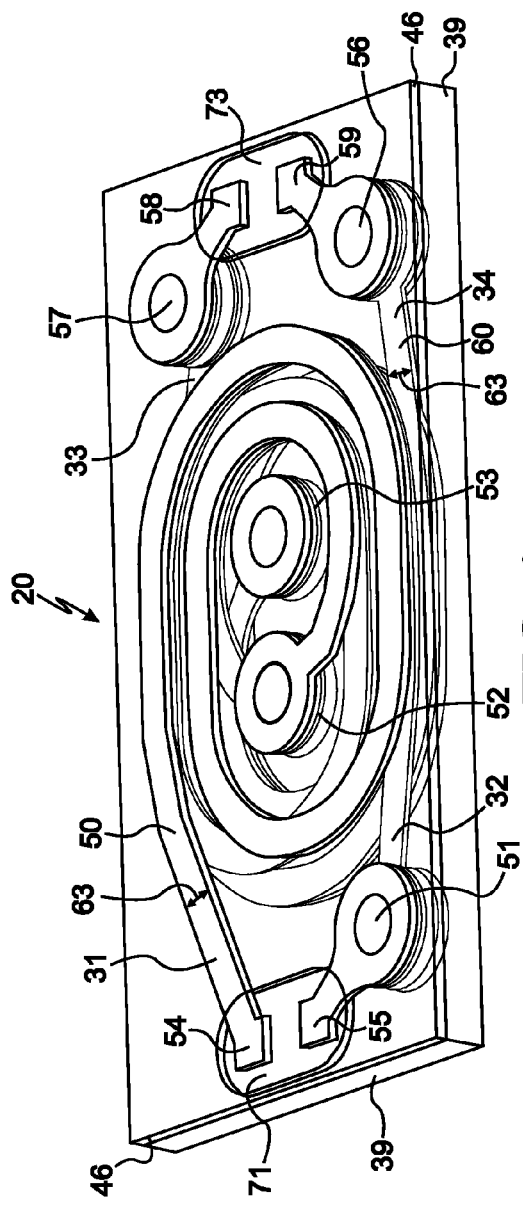
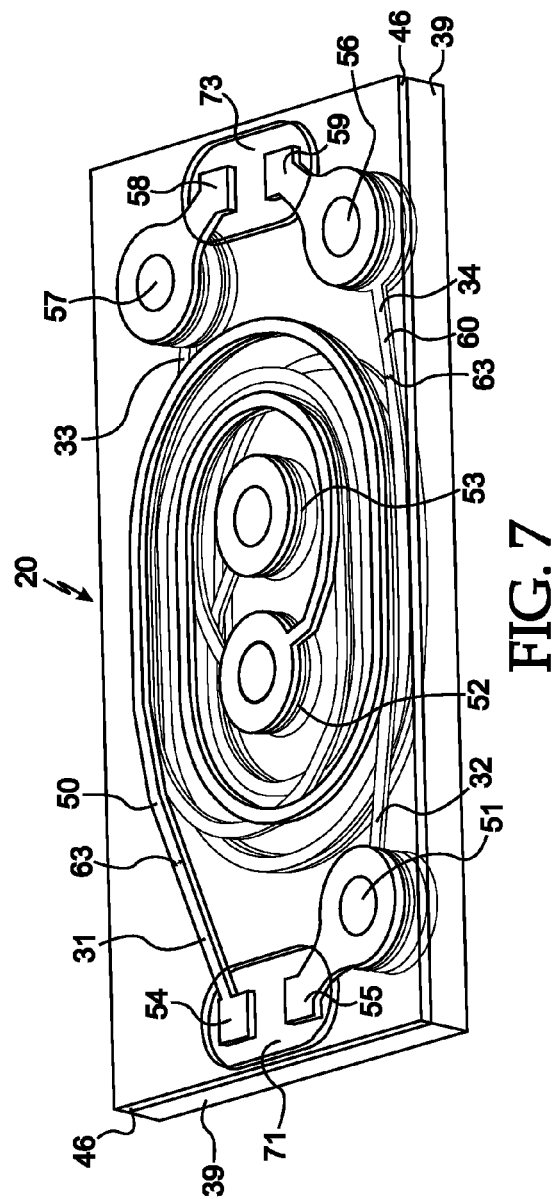

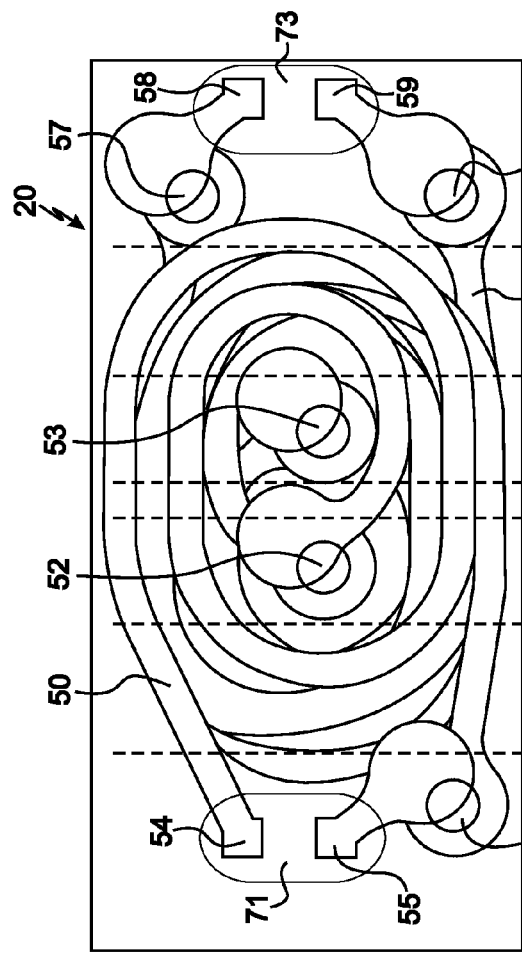
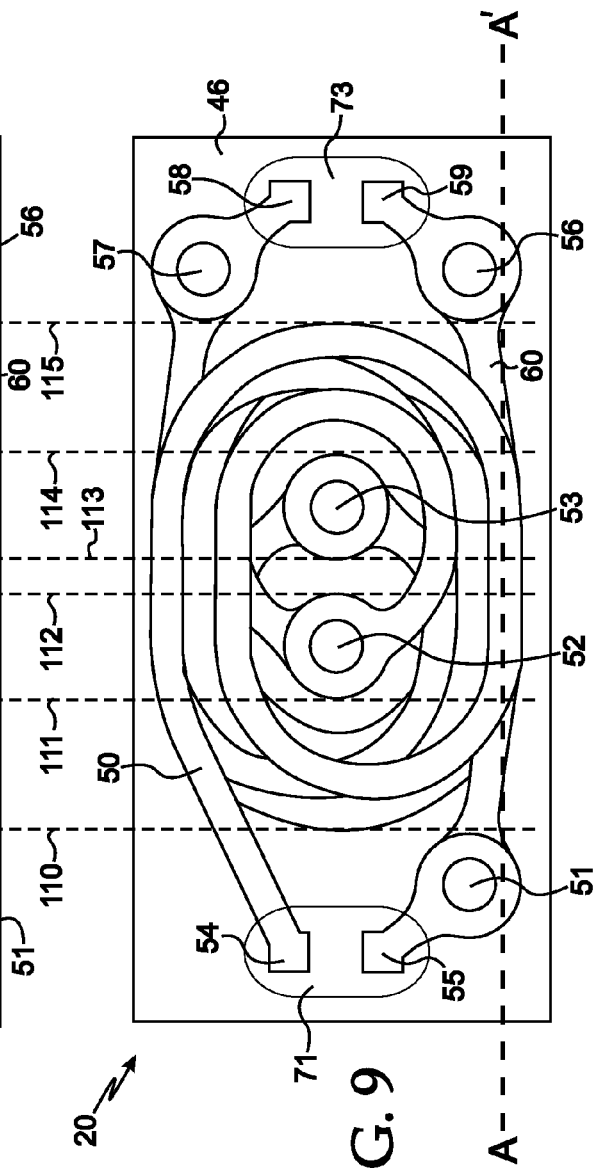
FIG. 8
FIG. 9

METHODS OF MAKING COIL TRANSDUCERS

RELATED APPLICATIONS

This application claims priority and other benefits from, and is a continuation-in-part of: (a) U.S. patent application Ser. No. 12/059,979 filed Mar. 31, 2008 entitled "Galvanic Isolators and Coil Transducers" to Fouquet et al. (hereafter "the '979 patent application"), now, pending, (b) U.S. patent application Ser. No. 12/059,747 filed Mar. 31, 2008 entitled "Coil Transducer with Reduced Arcing and Improved High Voltage Breakdown Performance Characteristics" to Fouquet et al. (hereafter "the '747 patent application"); now, U.S. Pat. No. 7,852,186, (c) U.S. patent application Ser. No. 11/512,034 filed Aug. 28, 2006 entitled "Galvanic Isolator" to Fouquet et al. (hereafter "the '034 patent application"), and now U.S. Pat. No. 7,791,900, (d) U.S. patent application Ser. No. 12/392,978 filed Feb. 25, 2009 to Fouquet et al. entitled "Miniature Transformers Adapted for Use in Galvanic Isolators and the Like" now, U.S. Pat. No. 7,741,943 (hereafter "the '978 patent application"). This application also hereby incorporates by reference herein in their respective entireties the foregoing '979 and '747 patent applications.

FIELD OF THE INVENTION

Various embodiments of the invention described herein relate to the field of data signal and power transformers or galvanic isolators and coil transducers, and more particularly to devices employing inductively coupled coil transducers to transmit and receive data and/or power signals across a dielectric or isolation barrier.

BACKGROUND

High voltage isolation communication devices known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required.

Prior art magnetic devices typically achieve high voltage isolation by employing opposing inductively-coupled coils, usually require high power levels (especially when high data rates are required), typically require the use of at least three separate integrated circuits or chips, and often are susceptible to electromagnetic interference ("EMI").

Prior art capacitive devices achieve voltage isolation by employing multiple pairs of transmitting and receiving electrodes, where for example a first pair of electrodes is employed to transmit and receive data, and a second pair of electrodes is employed to refresh or maintain the transmitted signals. Such capacitive devices typically exhibit poor high voltage hold-off or breakdown characteristics The design of small high speed galvanic isolators or coil transducers presents several formidable technical challenges, such as how to handle EMI, large-magnitude fast transients, and other forms of electrical noise while maintaining high voltage breakdown characteristics, and acceptable data or power transfer rates.

In some electrical circuits, logic signals are transmitted between two locations that must be kept electrically isolated from each other. For example, high voltages in medical test equipment must be kept separated from patients, and factory operators must be kept safe when operating high-voltage and/or high-current machinery. An isolator can be employed to separate a control circuit from a high-voltage and/or high-current circuit, where the control circuit is actuated by an operator, thereby protecting the operator. In addition, the control circuit itself must be isolated adequately from the high voltages and/or currents of the high-voltage and/or high-current circuit. In some types of isolators, however, signal transmission can be disrupted in environments containing considerable amounts of EMI. To provide reliable signal transmission, an isolator should be designed to reject or reduce EMI. What is needed are means and methods to minimize the susceptibility of small high speed galvanic isolators to EMI.

SUMMARY

In one embodiment, there is provided a coil transducer system comprising a coil transducer comprising a generally planar substrate comprising opposing upper and lower surfaces and including therein a dielectric barrier, the dielectric barrier comprising an electrically insulating, non-metallic, non-semiconductor, low-dielectric-loss material, a first electrically conductive coil disposed above the upper surface of the substrate, the first coil extending between first and second coil input terminals disposed at opposite ends thereof, a second electrically conductive coil disposed below the lower surface of the substrate, the second coil extending between first and second output coil terminals disposed at opposite ends thereof, and a transmitter circuit comprising first and second transmitter output terminals; wherein a first wire is electrically connected to, and extends between, the first transmitter output terminal and the first input coil terminal, a second wire is electrically connected to, and extends between, the second transmitter output terminal and the second input coil terminal, the first and second wires are substantially parallel to one another or exhibit substantially similar angles respecting a major axis of the coil transducer, the first and second wires have substantially a same first length, the first and second wires thereby being configured to minimize the pick-up of electromagnetic interference ("EMI") thereby.

In another embodiment, there is provided a method of making a coil transducer system comprising forming a coil transducer comprising a generally planar substrate comprising opposing upper and lower surfaces and including therein a dielectric barrier, the dielectric barrier comprising an electrically insulating, non-metallic, non-semiconductor, low-dielectric-loss material, a first electrically conductive coil disposed above the upper surface of the substrate, the first coil extending between first and second coil input terminals disposed at opposite ends thereof, a second electrically conductive coil disposed below the lower surface of the substrate, the second coil extending between first and second output coil terminals disposed at opposite ends thereof, and providing a transmitter circuit comprising first and second transmitter output terminals; electrically connecting a first wire between the first transmitter output terminal and the first input coil terminal; electrically connecting a second wire between the second transmitter output terminal and the second input coil terminal, and configuring the first and second wires to be substantially parallel to one another, or to exhibit substantially similar angles respecting an azimuth extending along a major axis of the coil transducer, and have substantially a same first length such that the first and second wires are configured to minimize the pick-up of electromagnetic interference ("EMI") thereby.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

FIG. 3 shows a top plan view of a coil transducer system according to another embodiment;

FIG. 4 shows a top plan view of a coil transducer system according to yet another embodiment;

FIG. 6 shows a top side perspective view of a coil transducer according to one embodiment;

FIG. 7 shows a top side perspective view of a coil transducer according to another embodiment;

FIG. 8 shows a top plan view of a coil transducer according to one embodiment, and FIG. 9 shows a top plan view of a coil transducer according to another embodiment.

The drawings are not necessarily to scale. Like numbers refer to like parts or steps throughout the drawings, unless otherwise noted.

DETAILED DESCRIPTIONS OF SOME PREFERRED EMBODIMENTS

Figure 1:
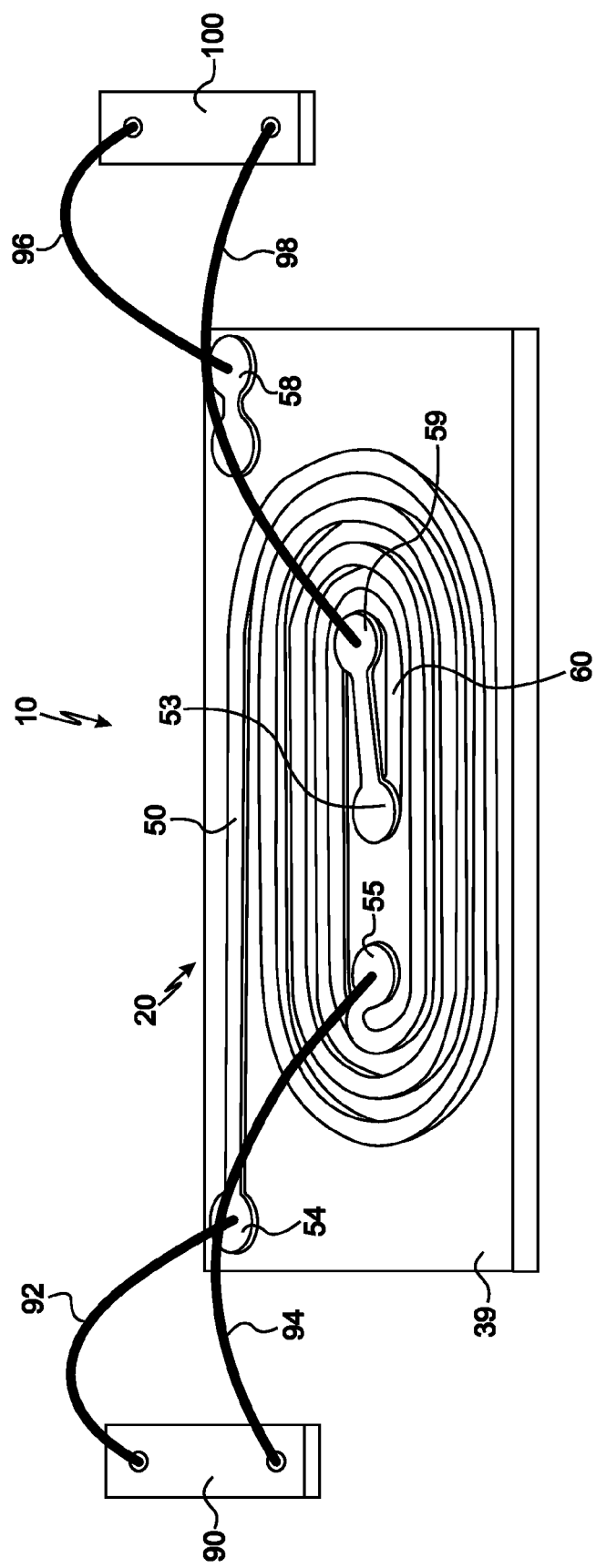
FIG. 1 shows a top perspective view of a coil transducer system of the prior art.

In the following description, specific details are provided to impart a thorough understanding of the various embodiments of the invention. Upon having read and understood the specification, claims and drawings hereof, however, those skilled in the art will understand that some embodiments of the invention may be practiced without hewing to some of the specific details set forth herein. Moreover, to avoid obscuring the invention, some well known circuits, materials and methods finding application in the various embodiments of the invention are not disclosed in detail herein.

In the drawings, some, but not all, possible embodiments of the invention are illustrated, and further may not be shown to scale.

The term "horizontal" as used herein is defined as a plane substantially parallel to the conventional plane or surface of the substrate of the invention, regardless of its actual orientation in space. The term "vertical refers to a direction substantially perpendicular to the horizontal as defined above. Terms such as "on," "above," "below," "bottom," "top," "side," "sidewall," "higher," "lower," "upper," "over" and "under" are defined in respect of the horizontal plane discussed above.

FIG. 1 shows a top perspective view of a coil transducer system 20 of the prior art, which as shown comprises first transmitting coil 50, second receiving coil 60, transmitter circuit 90, receiver circuit 100, substrate 39, and wirebonds 92, 94, 96 and 98 electrically connected to contacts or wirebond pads 54 and 55, and 58 and 59, respectively. Transmitter circuit 90 is typically configured to change an incoming signal waveform into a signal having a waveform suitable for driving primary transmitting or first coil 50. Receiver circuit 100 is typically configured to change the signal exiting the secondary receiver or second coil 60 back into a waveform that looks like the incoming signal. Transmitter circuit 90 and receiver circuit 100 are usually integrated circuits (ICs), and in conjunction with coil transducer 20 formed, for example, of flex circuit and other materials. They may be packaged in a format compatible with standard electronics assembly processes, such as printed circuit board assembly techniques. Such packaging may further comprise mounting the various components of coil transducer 20 on lead frames (not shown in FIG. 1), wirebonding the components together, and surrounding them with a molding material to hold everything together after sacrificial metal leads have been separated from the lead frames and formed into standard integrated circuit leads.

Continuing to refer to FIG. 1, it will be seen that coil transducer 20 comprises two metallized layers containing first and second coils 50 and 60, respectively, each of which coils winds inwardly from outside contacts 54 and 58, respectively, towards centrally disposed contacts 55 and 59, respectively. As a result of the coil geometry shown in FIG. 1, wire 94 extending from transmitter circuit 90 to centrally disposed contact 55, and wire 98 extending from receiver circuit 100 to centrally disposed contact 59, are rather long and looping, and extend a considerable length and height above coils 50 and 60. Moreover, it will be noted that portions of wires 94 and 98 are disposed essentially at right angles to the plane of coils 50 and 60. All these geometric factors concerning wires 94 and 98 connected electrically to centrally disposed contacts 55 and 59 result in coil transducer 10 being vulnerable susceptible to EMI. For example, it has been discovered through computer modeling that wires 94 and 98 act an antennae to pick up EMI due to their length and height over coil transducer 20. It has also been discovered through computer modeling that wires 94 and 98, because portions of such wires are located at approximate right angles to the plane in which coils 50 and 60 are disposed, and because EMI can be polarized in different spatial orientations, may pick up EMI signals that typically cannot be cancelled out using common mode rejection techniques employed in differential signal transmission and reception. In addition, it has been discovered that the differing lengths, heights above coil transducer 20, and geometries of wire pair 92 and 94, and wire pair 96 and 98, as the wires in each pair relate to one another, result in further opportunity for EMI to be picked up that cannot be cancelled out using common mode rejection techniques. Moreover, wires 92, 94, 96 and 98 exhibit relatively large electric fields and can not only pick up EMI, but also transmit signals in the manner of an antenna. In addition, wires of different lengths can be characterized by different frequency sensitivities. For example, long wires may exhibit greater sensitivity to low frequencies signals than short wires. The various embodiments illustrated in FIGS. 2 through 9 below, and the accompanying descriptions set forth below, overcome these and other problems.

Figure 2:
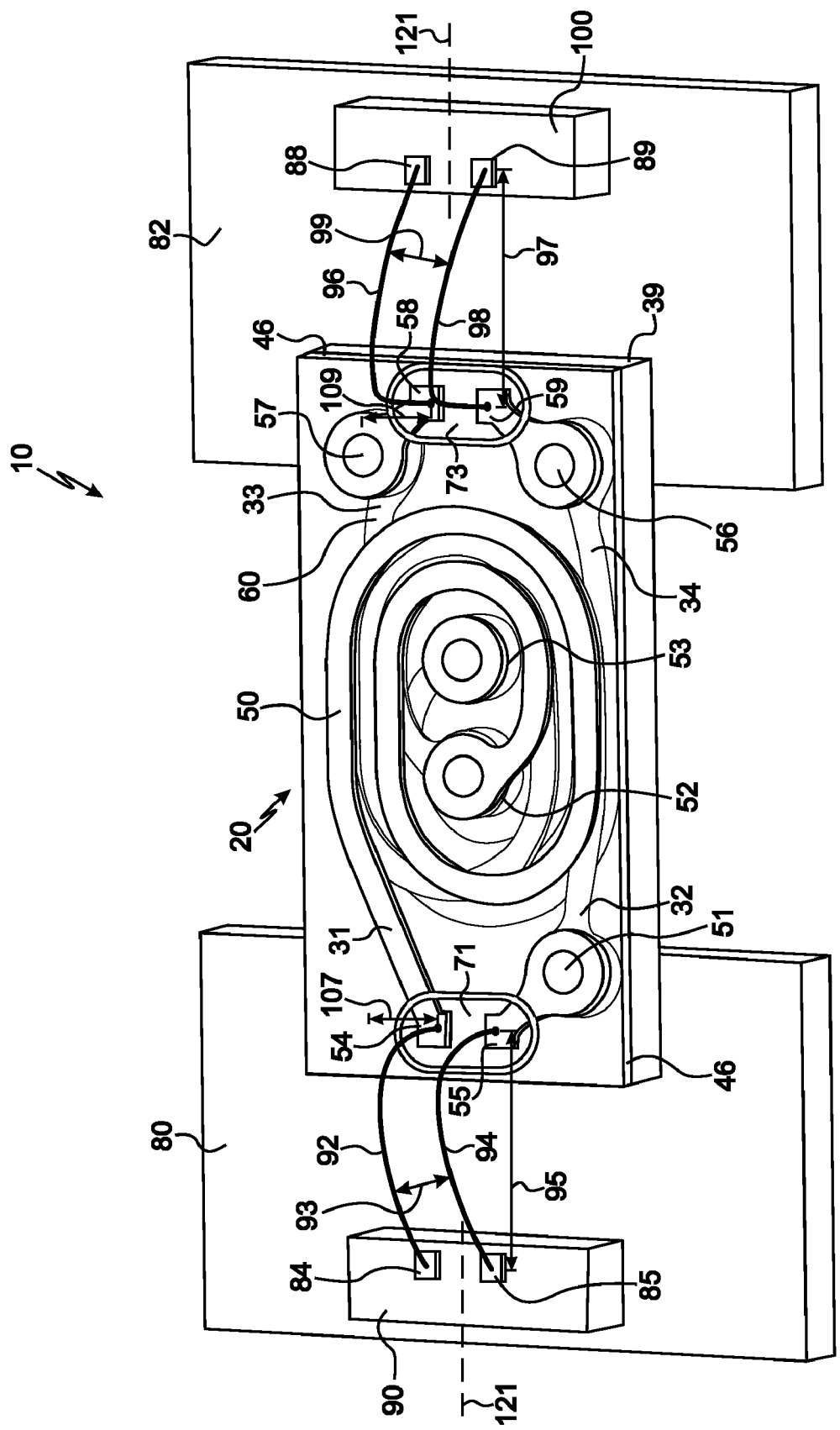
FIG. 2 shows a top perspective view of a coil transducer system according to one embodiment.

FIG. 2 shows a top perspective view of coil transducer system 10 according to one embodiment. As shown, coil transducer system 10 comprises coil transducer 20 operably attached to transmitter circuit 90, receiver circuit 100, input lead frame 80, and output lead frame 82. In a preferred embodiment, transmitter circuit 90 and receiver circuit 100 are integrated circuits (ICs). First transmitting coil 50, second receiving coil 60, transmitter circuit 90, receiver circuit 100, substrate 39, and contacts or wirebond pads 92, 94, 96 and 98 are electrically connected to wirebonds 54 and 55, and 58 and 59, respectively. In one embodiment, transmitter circuit 90 is configured to change an incoming signal waveform into a signal having a waveform suitable for driving primary transmitting or first coil 50, and receiver circuit 100 is configured to change the signal exiting the secondary receiver or second coil 60 back into a waveform that looks like the incoming signal. Transmitter circuit 90 and receiver circuit 100 are usually ICs, and in conjunction with coil transducer 20 formed, for example, of flex circuit and other materials, may be packaged in a format compatible with standard electronics assembly processes, such as printed circuit board assembly techniques. Note that electrically insulating cover layers are preferably disposed over coil 50 and beneath coil 60 to prevent shorting to the lead frames, for example.

Continuing to refer to FIG. 2, coil transducer system 10 comprises coil transducer 20, which in turn comprises a generally planar substrate 39 comprising opposing upper and lower surfaces, and which includes a dielectric barrier disposed therewithin. The dielectric barrier comprises an electrically insulating, non-metallic, non-semiconductor, low-dielectric-loss material. First electrically conductive coil 50 is disposed within or upon substrate 39, and the first coil extends between first and second coil input terminals 31 and 32 disposed at opposite ends thereof. Second electrically conductive coil 60 is disposed within or upon an opposing side or portion of substrate 39, and the second coil extends between first and second output coil terminals 33 and 34 disposed at opposite ends thereof. Transmitter circuit 90, which in the embodiment illustrated in FIG. 2 is an integrated circuit ("IC"), comprises first and second transmitter output terminals 84 and 85, respectively. Receiver circuit 100, which in the embodiment illustrated in FIG. 2 is also an IC, comprises first and second receiver input terminals 88 and 89, respectively.

FIG. 2 shows that a first wire 92 is electrically connected to, and extends between, the first transmitter output terminal 84 and the first input coil terminal 54. A second wire 94 is electrically connected to, and extends between, the second transmitter output terminal 85 and the second input coil terminal 55. A third wire 96 is electrically connected to, and extends between, the first receiver input terminal 88 and the first output coil terminal 58. A fourth wire 98 is electrically connected to, and extends between, the second receiver input terminal 89 and the second output coil terminal 59.

As further shown in FIG. 2, the first and second wires 92 and 94 are substantially parallel to one another, exhibit substantially similar angles respecting a major axis 121 of coil transducer 20, have substantially a same first length 95, and rise substantially a same height 107 above an upper surface of substrate 39. Also as shown in FIG. 2, the third and fourth wires 96 and 98 may be substantially parallel to one another, exhibit substantially similar angles respecting a major axis 121 of coil transducer 20, have substantially a same second length 97, and/or rise substantially a same height 109 above an upper surface of substrate 39.

In preferred embodiments, a vertical distance over which the first, second, third or fourth wires extends above transmitter 90 or receiver 100 and coil transducer 20 does not exceed about 10 mils, or does not exceed about 5 mils. Also in preferred embodiments, horizontal lengths 95 and 97 of wires 92, 95, 96 and 98 range between about 5 mils and about 30 mils, or do not exceed about 20 mils. In further preferred embodiments, horizontal separation 93 between wires 92 and 94, or horizontal separation 99 between wires 96 and 98, does not exceed about 15 mils. Moreover, in preferred embodiments wires 92 and 94 are separated by a distance 93 that remains relatively constant, or that remains relatively small, between transmitter IC 90 and contacts 54 and 55, while wires 96 and 98 are separated by a distance 99 that remains relatively constant between receiver IC 100 and contacts 58 and 59. The relative orientations, lengths, and heights of wires 92, 94, 96 and 98 are configured to minimize the pick-up of electromagnetic interference ("EMI") thereby. Note also that in preferred embodiments the respective ends of wires 92, 94, 96 and 98 are wirebonded to contacts 54, 55, 58 and 59, respectively, and that transmitter 90 and receiver 100 are integrated circuits.

Contributing to the reduction in the pick-up of EMI by coil transducer system 10 is the fact that the embodiment of coil transducer 10 shown in FIG. 2 comprises four separate metallized layers, with first and second metallized layers forming first transmitting coil 50, and third and fourth metallized layers forming second receiving coil 60. As illustrated, the first, second, third and fourth metallized layers are each disposed vertically at different discrete levels. By using two metallized layers for each coil, wires 92 and 94, and 96 and 98, can be made appreciably shorter than those of single layer coil transducer system 10 illustrated in FIG. 1, which as described above results in long and looping wires 92, 94, 96 and 98 which have been discovered to act as antennae and exacerbate the effects of undesired EMI.

FIG. 3 shows a top plan view of a coil transducer system 10 according to another embodiment, where wires 92 and 94 exhibit substantially similar angles $\alpha_1$ and $\alpha_2$ respecting major parallel axes 123 and 124 of coil transducer 20. In a preferred embodiment, the difference between angles $\alpha_1$ and $\alpha_2$ is less than or equal to about 15 degrees. Similarly, wires 96 and 98 exhibit substantially similar angles $\beta_1$ and $\beta_2$ respecting major parallel axes 123 and 124 of coil transducer 20. In a preferred embodiment, the difference between angles $\beta_1$ and $\beta_2$ is less than or equal to about 15 degrees. The configurations of wires 92, 94, 96 and 98 shown in FIG. 3 minimize the pick-up of undesired EMI by coil transducer 20.

FIG. 4 shows a top plan view of a coil transducer system 10 according to yet another embodiment, where wires 92*a* and 92*b* are substantially parallel to one another, wires 94*a* and 94*b* are substantially parallel to one another, and pairs 92*a*/92*b* and 94*a*/94*b* are also substantially parallel to one another. Further as shown in FIG. 4, wires 96*a* and 96*b* are substantially parallel to one another, wires 98*a* and 98*b* are substantially parallel to one another, and pairs 96*a*/96*b* and 98*a*/98*b* are also substantially parallel to one another. The configurations of wire pairs 92*a*/92*b*, 94*a*/94*b*, 96*a*/96*b*, and 98*a*/98*b* shown in FIG. 4 reduce the parasitic inductance and resistance of the connections between transmitter 90 and receiver 100 to coil transducer system 10 by about a factor of two. This improves the power transfer to and from coil transducer 20. It is desirable for the wire bonds 92*a*/92*b*, 94*a*/94*b*, 96*a*/96*b*, and 98*a*/98*b* to be parallel and have the same angles as noted earlier so that impinging EMI picked up by wire bonds 92*a*/92*b*, 94*a*/94*b*, 96*a*/96*b*, and 98*a*/98*b* only induces small common mode signals into bond wires 92*a*/92*b*, 94*a*/94*b*, 96*a*/96*b*, and 98*a*/98*b* rather than differential signals.

Figure 5:
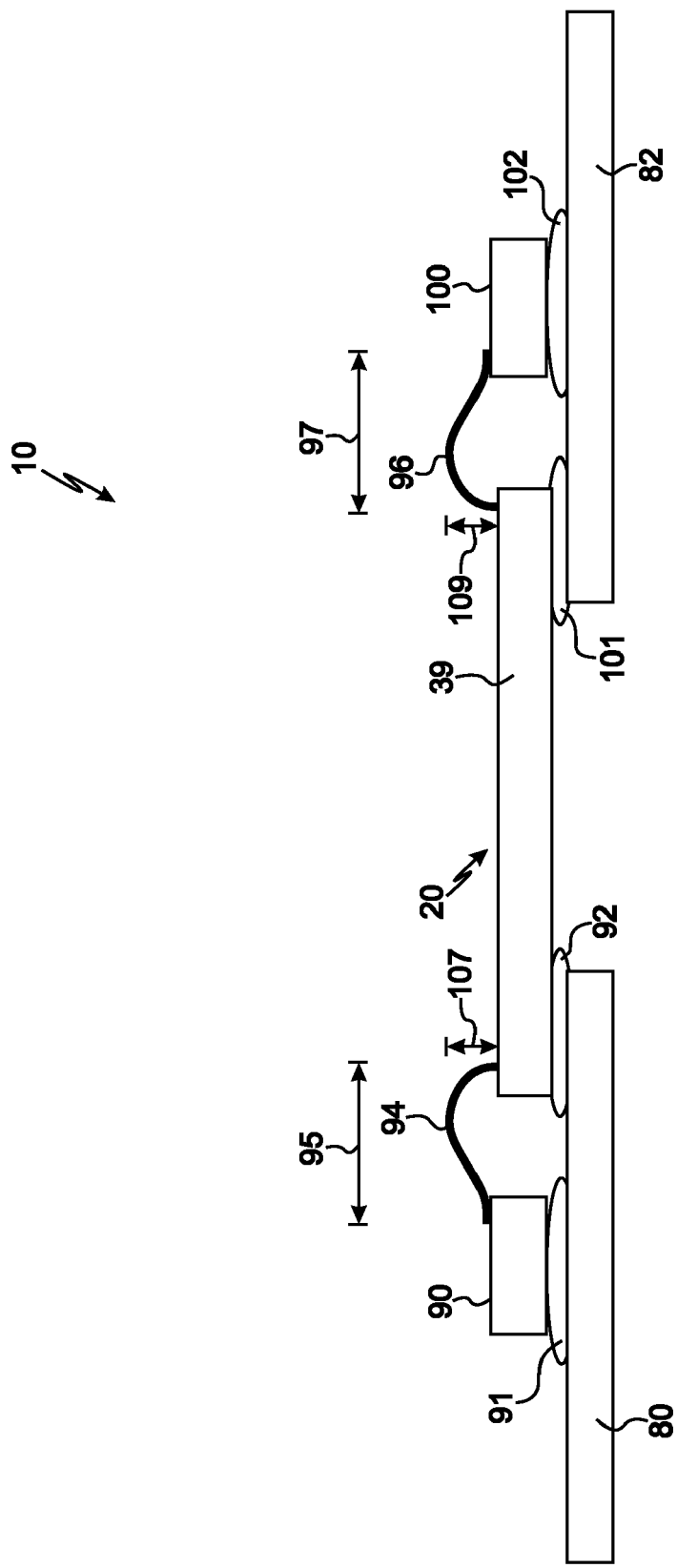
FIG. 5 shows a side view of a coil transducer system according to still another embodiment.

FIG. 5 shows a side view of coil transducer system 10 according to still another embodiment. As shown in FIG. 5, wires 94 and 96 have lengths 95 and 97, and rise heights 107 and 109 above an upper surface of substrate 39 of coil transducer 20. To reduce the pick-up of EMI, it is desirable to make lengths 95 and 97 as short as possible, and to make heights 107 and 109 as small as possible. As further illustrated in FIG. 5, adhesive 91 attaches transmitter 90 to first lead frame 80, while adhesive 102 attaches receiver 100 to second lead frame 82. Coil transducer 20 is secured to first lead frame by adhesive 92 and to second lead frame 82 by adhesive 101. In a preferred embodiment, adhesives 91, 92, 101 and 102 comprise epoxy. Note the squish-out zones associated with adhesives 91, 92, 101 and 102.

FIG. 6 shows a top side perspective view of coil transducer 20 according to one embodiment, while FIG. 7 shows a top side perspective view of coil 20 transducer according to another embodiment. Note the embodiment of coil transducer 20 shown in FIG. 6 features trace widths 63 of coils 50 and 60 that are substantially wider than those of trace widths 63 of coils 50 and 60 in FIG. 7. It has been discovered that making the trace widths 63 of coils 50 and 60 thinner reduces the capacitance between coils 50 and 60, and thereby reduces EMI pick-up. It has further been discovered that trace widths not exceeding about 5 mils, or not exceeding about 3 mils, are preferred to minimize the capacitance between coils 50 and 60. Transient common mode events may have significant potential differences between the ground potentials for transmitter 90 and receiver 100. Sudden changes in potential may require common mode currents to flow to charge the capacitance between coils 50 and 60 of coil transducer 20. It is desirable to reduce the capacitance values between coils 50 and 60 to minimize the current needed to charge the common mode capacitances for common mode events.

FIG. 8 shows a top plan view of coil transducer 20 according to one embodiment, and FIG. 9 shows a top plan view of coil transducer 20 according to another embodiment. It will be noted that coils 50 and 60, and the electrical traces and contacts associated therewith, in coil transducer 20 of FIG. 8 are not as well vertically aligned from metal layer to metal layer as those of FIG. 9. It has been discovered that offsetting the vertical alignment of coils 50 and 60, and the electrical traces and contacts associated therewith, in respect of one another can reduce the capacitance between first and second coils 50 and 60 and other electrically conductive portions of coil transducer 20, and thereby can reduce the pick-up of undesired EMI. The respective vertical alignments of the metal layers forming coils 50 and 60, and of the electrical traces and contacts associated therewith, in coil transducers 20 of FIGS. 8 and 9 may be compared by referring to alignment reference lines 110, 111, 112, 113, 114 and 115 drawn between coil transducers 20 of FIGS. 8 and 9.

Figure 10:
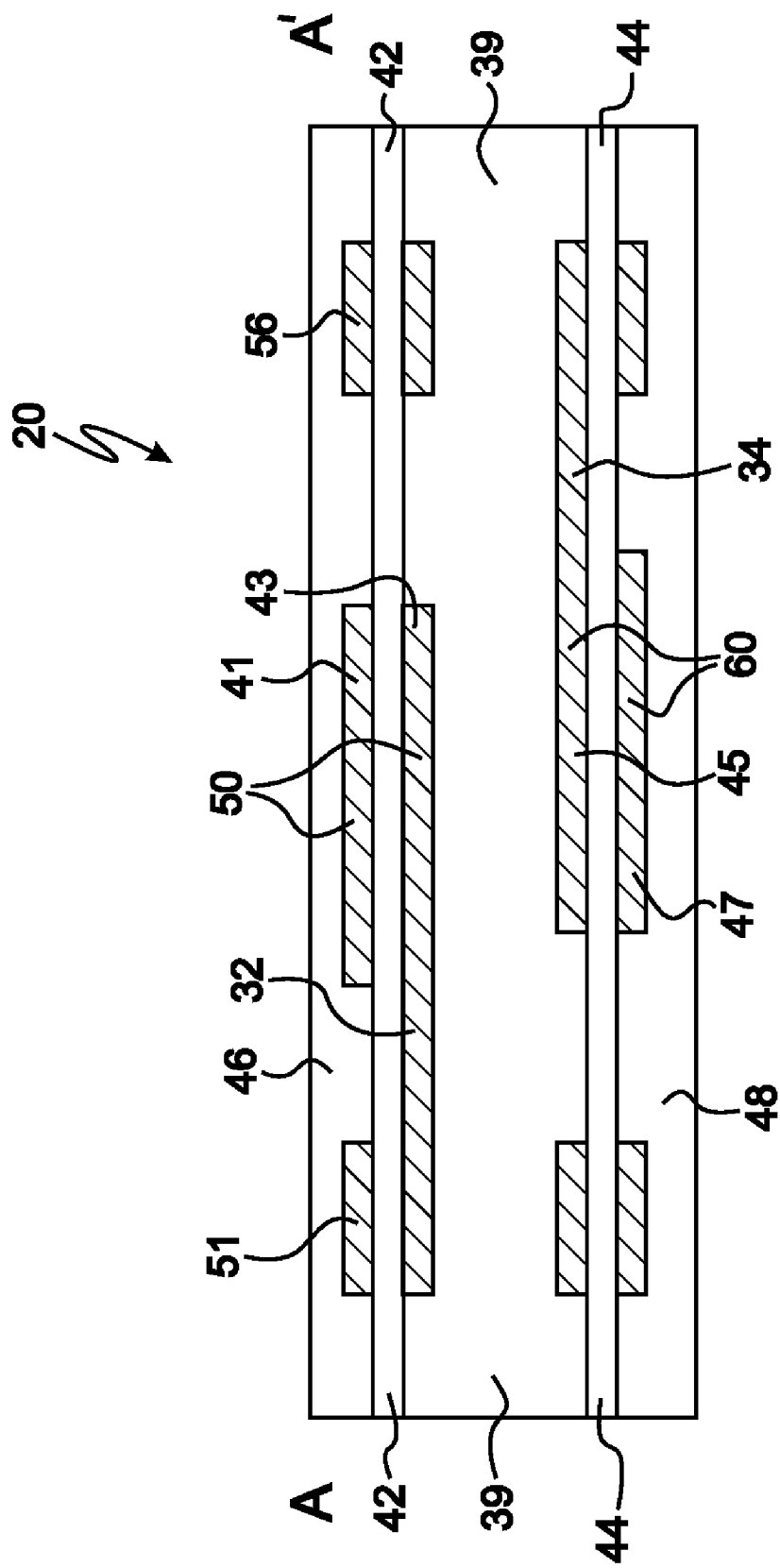
FIG. 10 shows a cross-sectional view of coil transducer 20 of FIG. 9.

FIG. 10 shows a cross-sectional view of coil transducer 20 of FIG. 9 taken through line A'-A' thereof. As shown in FIG. 10, substrate 39 comprises a generally planar electrically insulating and dielectric barrier core structure having opposing upper and lower surfaces, and forms a dielectric barrier between coil 50 and coil 60. As further shown in FIG. 10, in one embodiment substrate 39 is disposed between upper layer 42 and lower layer 44, and has upper and lower surfaces thereof in contact with layers 42 and 44, respectively. Cover layers 46 and 48 are preferably disposed above upper layer 42 and coil 50, and below lower layer 44 and coil 60, respectively. Upper layer 42 has metal layers 41 and 43 patterned on the top and bottom surfaces thereof to form first coil 50. Metal layer 43 is electrically connected to metal layer 51 via lead 32. Likewise, lower layer 44 has metal layers 45 and 47 lithographically patterned on the top and bottom surfaces thereof to form second coil 60. Metal layer 45 is electrically connected to lead 34. Metal layers 41, 43, 45 and 47 may be formed of gold, nickel, silver, copper, tungsten, tin, aluminum, and other suitable metals, or metal alloys or combinations thereof.

Other methods and means may also be employed to reduce the pick-up of EMI by coil transducer 20 or coil transducer system 10. For example, a spacer layer may be located above the upper surface of coil transducer 20 or below the lower surface of coil transducer 20, where the spacer layer comprises a low-dielectric-loss material and is configured to minimize the pick-up of EMI by at least some electrically conductive portions of coil transducer 20. In one embodiment, such a spacer layer has a thickness ranging between about 25 mils and about 50 mils. In another example, coil transducer 20 or coil transducer system 10 comprises a metal shield disposed above the spacer layer when the spacer layer is located above the upper surface of coil transducer 20, or below the spacer layer when the spacer layer is located below the lower surface of coil transducer 20. The metal shield further reduces the pick-up of EMI. In yet another example, substantially the same low-dielectric-loss materials having substantially the same thicknesses are disposed above or near the upper surface of coil transducer 20 and below or near the lower surface of coil transducer 20 thereby to present substantially similar environments to EMI impinging from above and below coil transducer 20 or coil transducer system 10.

Note that in a preferred embodiment of coil transducer system 10 transmitter circuit 90 is configured to provide differential output signals across input terminals 54 and 55 of first coil 50, and receiver circuit 100 is configured to receive differential output signals across output terminals 58 and 59 of second coil 60. In further preferred embodiments, first and second coils 50 and 60 are spatially arranged and configured respecting one another such that at least one of power and data signals may be transmitted by first coil 50 to second coil 60 across or through substrate 39.

In addition, substrate 39 may comprise any one or more of KAPTON™, fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, and plastic.

Coil transducer system 10 preferably exhibits a breakdown voltage between first coil 50 and 60 second coil 60 that exceeds about 2,000 volts RMS when applied over a time period of about one minute, exceeds about 2,000 volts RMS when applied over a time period of about six minutes, or exceeds about 2,000 volts RMS when applied over a time period of 24 hours. Even more preferably, coil transducer system 10 exhibits a breakdown voltage between first coil 50 and second coil 60 that exceeds about 5,000 volts RMS when applied over a time period of about one minute, exceeds about 5,000 volts RMS when applied over a time period of about six minutes, or exceeds about 5,000 volts RMS when applied over a time period of 24 hours.

Note that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A method of making a coil transducer system, comprising:
    forming a coil transducer comprising a generally planar substrate comprising opposing upper and lower surfaces and including therein a dielectric barrier, the dielectric barrier comprising an electrically insulating, non-metallic, non-semiconductor, low-dielectric-loss material, a first electrically conductive coil disposed above the upper surface of the substrate, the first coil extending between first and second coil input terminals disposed at opposite ends thereof; a second electrically conductive coil disposed below the lower surface of the substrate; the second coil extending between first and second output coil terminals disposed at opposite ends thereof; and providing a transmitter circuit comprising first and second transmitter output terminals;

electrically connecting a first wire between the first transmitter output terminal and the first input coil terminal;

electrically connecting a second wire between the second transmitter output terminal and the second input coil terminal; and configuring the first and second wires to be substantially parallel to one another, or to exhibit substantially similar angles respecting an azimuth extending along a major axis of the coil transducer, and have substantially a same first length such that the first and second wires are configured to minimize the pick-up of electromagnetic interference ("EMI") thereby.

2. The method of claim 1, wherein the first and second wires are electrically connected to the coil transducer and the transmitter circuit such that an angle between the first and second wires does not exceed about fifteen degrees.

3. The method of claim 1, wherein the first and second wires are electrically connected to the coil transducer and the transmitter circuit such that the substantially similar angles thereof each range between about 0 degrees and about 10 degrees with respect to the major axis.

4. The method of claim 1, wherein the first wire and the second wire are electrically extended a vertical distance over the transmitter circuit and the coil transducer that is substantially the same and does not exceed about 5 mils.

5. The method of claim 1, wherein the first length is selected to range between about 5 mils and about 30 mils.

6. The method of claim 1, wherein a horizontal separation is provided between the first wire and the second wire that does not exceed about 15 mils.

7. The method of claim 1, further comprising providing a receiver circuit comprising first and second input receiver terminals.

8. The method of claim 7, further comprising electrically connecting a third wire between the first receiver input terminal and the first output coil terminal, and electrically connecting a fourth wire between the second receiver input terminal and the second output coil, the third and fourth wires being substantially parallel to one another.

9. The method of claim 8, wherein the third and fourth wires are configured to have substantially a same third length such that the pick-up of electromagnetic interference ("EMI") thereby is minimized.

10. The method of claim 8, wherein the third and fourth wires are electrically connected to the coil transducer and the transmitter circuit such that an angle between the third and fourth wires does not exceed about fifteen degrees.

11. The method of claim 8, wherein the third wire and the fourth wire are extended a vertical distance over the receiver circuit and the coil transducer that does not exceed about 5 mils.

12. The method of claim 8, wherein the third wire has a length selected to range between about 5 mils and about 30 mils.

13. The method of claim 8, wherein a horizontal separation is provided between the third wire and the fourth wire that does not exceed about 15 mils.

14. The method of claim 8, wherein a pair of substantially parallel wires is provided for each of the third wire and the fourth wire.

15. The method of claim 8, wherein the receiver circuit is configured to provide differential output signals across the output terminals of the second coil.

16. The method of claim 1, wherein at least one of the first coil and the second coil is formed to have a trace width not exceeding about 5 mils thereby to minimize the capacitance between the first and second coils.

17. The method of claim 1, wherein a pair of substantially parallel wires is provided for each of the first wire and the second wire.

18. The method of claim 1, wherein the transmitter circuit is configured to provide differential output signals across the input terminals of the first coil.

* * * * *